US012066588B2

(12) United States Patent
Walsh et al.

(10) Patent No.: US 12,066,588 B2
(45) Date of Patent: Aug. 20, 2024

(54) SELECTIVE SOLID-STATE ISOLATION OF NMR CIRCUIT ELEMENTS USING BACK-TO-BACK FIELD EFFECT TRANSISTORS

(71) Applicant: Vista Clara Inc., Mukilteo, WA (US)

(72) Inventors: David Walsh, Shoreline, WA (US); Elliot Grunewald, Seattle, WA (US)

(73) Assignee: Vista Clara Inc., Mukilteo, WA (US)

( * ) Notice: Subject to any disclaimer, the term of this patent is extended or adjusted under 35 U.S.C. 154(b) by 219 days.

(21) Appl. No.: 17/647,876

(22) Filed: Jan. 13, 2022

(65) Prior Publication Data

US 2023/0221455 A1   Jul. 13, 2023

(51) Int. Cl.
  *G01V 3/14* (2006.01)
  *G01V 3/38* (2006.01)
  *H03K 17/687* (2006.01)

(52) U.S. Cl.
  CPC .................. *G01V 3/14* (2013.01); *G01V 3/38* (2013.01); *H03K 17/6874* (2013.01)

(58) Field of Classification Search
  CPC ... G01V 3/14; G01V 3/38; G01V 3/32; H03K 17/6874
  See application file for complete search history.

(56) References Cited

U.S. PATENT DOCUMENTS 11,796,613 B2 * 10/2023 Twieg ................ G01R 33/3642
2022/0120931 A1 * 4/2022 Song ........................ G01V 3/38

OTHER PUBLICATIONS

"Fairchild Semiconductor—Photovoltaic Solid-State Relay Optocouplers," Fairchild Semiconductor Corporation, 2003, 8 pages.
Mandal et al., "An ultra-broadband low-frequency magnetic resonance system," Journal of Magnetic Resonance 242 (2014) 113-125, 14 pages.
Nacher et al., "Doppler-free spectroscopy of the lowest triplet states of helium using double optical resonance," The European Physical Journal D : Atomic, molecular, optical and plasma physics, EDP Sciences, 2021, 75, pp. 223, 17 pages.
Lin et al., "An Improved Air-core Coil Sensor with a Fast Switch and Differential Structure for Prepolarization Surface Nuclear Magnetic Resonance," in IEEE Transactions on Instrumentation and Measurement, vol. 70, pp. 1-10, 2021, Art No. 9512710, 10 pages.

* cited by examiner

*Primary Examiner* — Jay Patidar
(74) *Attorney, Agent, or Firm* — Lee & Hayes, P.C.

(57) ABSTRACT

Nuclear Magnetic Resonance (NMR) electronics that employ selective solid-state isolation of circuit elements can include solid-state switches, such as back-to-back Field Effect Transistor (FET) pairs, and isolated gate drive electronics adapted to operate the solid-state switches in order to selectively decouple induction coils from receive electronics. The solid-state switches can be placed in series to achieve higher standoff voltages, and can be configured for low on resistance and short switching times. The gate drive electronics can include electrical isolation components adapted to enhance standoff voltages and reduce electrical noise at the selectively isolated receive electronics.

24 Claims, 10 Drawing Sheets

SELECTIVE SOLID-STATE ISOLATION OF NMR CIRCUIT ELEMENTS USING BACK-TO-BACK FIELD EFFECT TRANSISTORS

STATEMENT OF GOVERNMENT SUPPORT

This invention was made with Government support under Agreement Nos. DE-SC0013293 and DE-SC0019671, awarded by the Department of Energy. The Government has certain rights in this invention.

BACKGROUND

Certain electrical circuits, such as those used in Nuclear Magnetic Resonance (NMR) systems, incorporate both high voltages and sensitive circuit elements. For example, Surface NMR (SNMR) systems are used to detect subsurface liquids in the Earth's crust. A simplified SNMR system can include transmit electronics, an induction coil, and sensitive receive electronics. During a high voltage transmit stage, the transmit electronics apply a very powerful high voltage Alternating Current (AC) pulse to the induction coil. When the induction coil is positioned on or near the Earth's surface, the transmit pulse projects a powerful alternating magnetic field into the ground, which stimulates a magnetic resonance response in any underground liquids.

The sensitive receive electronics must be decoupled from the induction coil during the transmit stage, when a high voltage is present, to avoid damaging the receive electronics. After the transmit stage, the receive electronics must be recoupled with the induction coil. The magnetic resonance response from the underground liquids generates weak NMR voltage signals on the induction coil, and the receive electronics can process and record these voltage signals. The resulting information can be used to determine depths, quantities, and locations of the subsurface liquids.

Circuits such as the above described SNMR circuit require a switching mechanism to decouple and recouple circuit elements, such as the sensitive receive electronics, from other portions of the circuit, such as the transmit electronics and the induction coil when a high-voltage is present. In other words, some circuits require a switching mechanism to selectively isolate certain circuit elements.

Traditionally, relay switches have been used as the switching mechanism. Relay switches can be opened and closed to selectively isolate circuit elements. While relay switches achieve very high standoff voltages, relay switches also have certain drawbacks. For example, relay switches and their associated control electronics can generate unwanted switching noise or ringing which can interfere with measurement of desired NMR signal voltages. Also, relay switches can have activation times that are slower than may be desired, resulting in a long dead-time after the transmit pulse before signals can be recorded.

Thus, there is a need for improved fast and low-noise mechanisms to selectively isolate circuit elements, in SNMR as well as other circuits that incorporate selectively isolated circuit elements. The above-described background is merely intended to provide a contextual overview of some current issues, and is not intended to be exhaustive. Other contextual information may become further apparent upon review of the following detailed description.

SUMMARY

Technologies applicable to selective solid-state isolation of circuit elements are disclosed, including circuits that employ solid-state switches to decouple circuit elements, gate drive electronics to operate the solid-state switches, and corresponding methods to operate the solid-state switches to decouple circuit elements.

An example circuit according to this disclosure can include: an alternating voltage element configured to be a source of alternating voltage between two connection terminals; first and second electrical connections connecting the connection terminals of the alternating voltage element; and a selectively decouplable circuit element. A first solid-state switch can be implemented, e.g., by a first pair of back-to-back field effect transistors (FETs) with gate drive electronics, and can be adapted to selectively decouple the first electrical connection. A second solid-state switch can be implemented by a second pair of back-to-back FETs with gate drive electronics, and can optionally be adapted to selectively decouple the second electrical connection. A switch controller can be adapted to operate the first and second solid-state switches in order to selectively decouple the selectively decouplable circuit element from the alternating voltage element.

Additional solid state switches, also operated by gate drive electronics, can be placed in series with the first and/or second solid-state switches in order to achieve higher standoff voltages. Furthermore, the FETs used in the solid-state switches can be selected according to this disclosure to achieve a combination of low on resistance, high standoff voltage, and short switching time.

The solid-state switches can each include isolated gate drive electronics to create an isolated gate driver for each back-to-back FET pair, thereby reducing electrical noise and allowing the FETs operate at high-voltage with independent ground references. Example electrical isolation components include optocouplers and isolated power supplies that can be used to create independent ground references that are independent from other system grounds, as described herein.

The technologies disclosed herein can be applied in the context of NMR and SNMR circuits, as disclosed herein. For example, the alternating voltage element can comprise an induction coil for an NMR measurement device and may be a source of alternating voltage through direct or indirect coupling to transmit electronics. The selectively decouplable circuit element can comprise receive electronics for the NMR measurement device. The switch control electronics can be adapted to operate the first and second solid-state switches in order to decouple the receive electronics from the induction coil during a transmit stage of the NMR measurement device and to couple the receive electronics to the induction coil during a receive stage of the NMR measurement device.

Further aspects and variations are discussed in detail below.

BRIEF DESCRIPTION OF THE DRAWINGS

Various features and attendant advantages of the disclosed technologies will become fully appreciated when considered in conjunction with the accompanying drawings, in which like reference characters designate the same or similar parts throughout the several views, and wherein.

DETAILED DESCRIPTION

Figure 1:
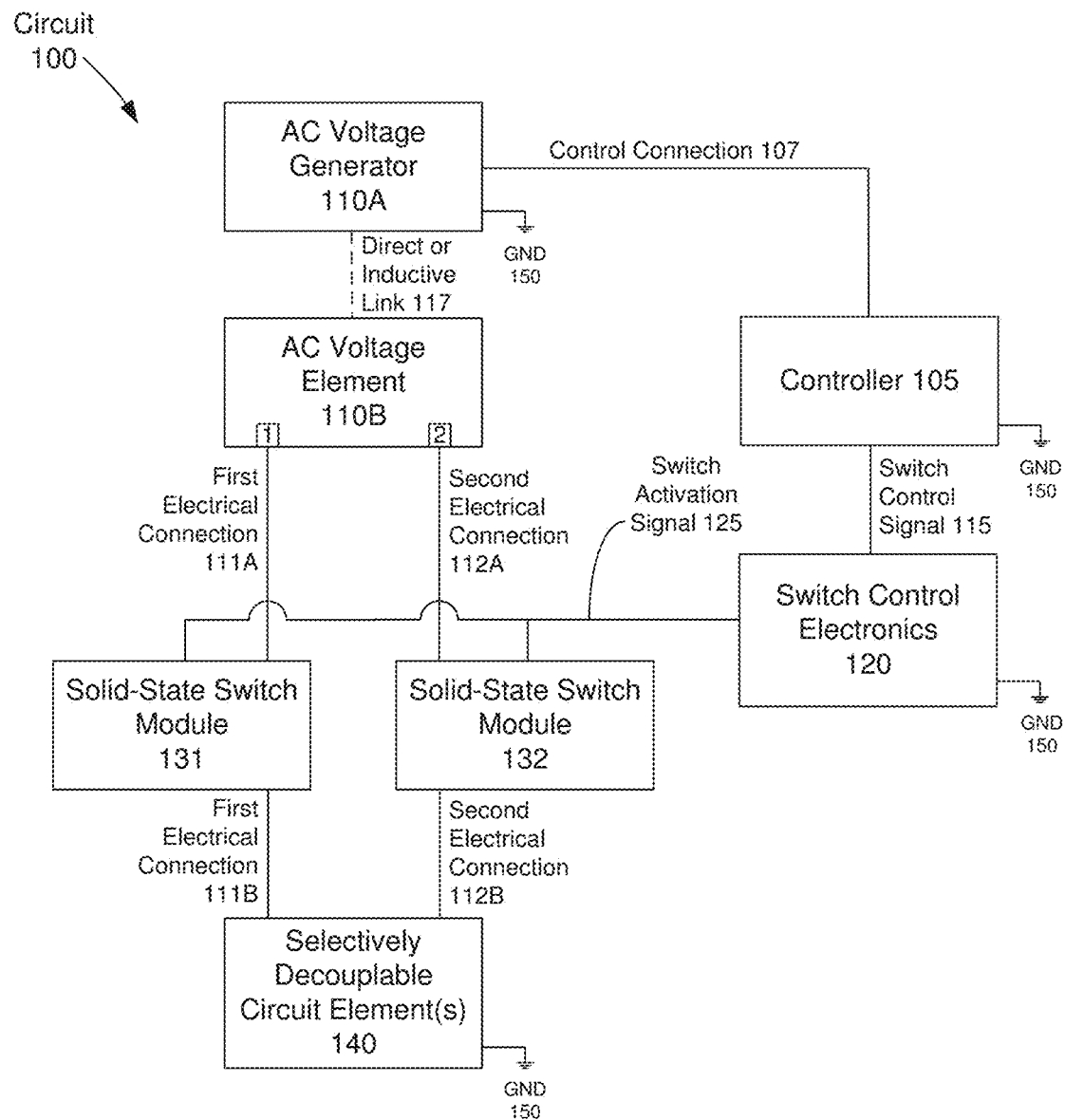
FIG. 1 illustrates an example circuit comprising solid-state switches to selectively decouple circuit elements, in accordance with various aspects and embodiments of the subject disclosure.

Prior to explaining embodiments of the invention in detail, it is to be understood that the invention is not limited to the details of construction or arrangements of the components and method steps set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

FIG. 1 illustrates an example circuit comprising solid-state switch modules to selectively isolate circuit elements, in accordance with various aspects and embodiments of the subject disclosure. The example circuit 100 includes an alternating current (AC) voltage generator 110A, an AC voltage element 110B comprising connection terminals 1 and 2, a first electrical connection 111A, 111B, a solid-state switch module 131, selectively decouplable circuit element(s) 140, a second electrical connection 112A, 112B, and a solid-state switch module 132. The solid-state switch modules 131, 132 can provide AC isolation to selectively decouple the selectively decouplable circuit element(s) 140 from the AC voltage present on the connection terminals 1 and 2 of the AC voltage element 110B.

The first electrical connection 111A, 111B is between connection terminal 1 of AC voltage element 110B and the selectively decouplable circuit element(s) 140. The solid-state switch module 131 is positioned on the first electrical connection, and solid-state switch module 131 is between 111A and 111B. Solid-state switch module 131 is adapted to selectively decouple and recouple the first electrical connection 111A and 111B. The second electrical connection 112A, 112B is between the connection terminal 2 of the AC voltage element 110B and the selectively decouplable circuit element(s) 140. Solid-state switch module 132 is positioned between the second electrical connection 112A and 112B and is adapted to selectively decouple and recouple the second electrical connection 112A and 112B.

Each solid-state switch module 131, 132 is connected to the switch control electronics 120, which is connected to a controller 105. The switch control electronics 120 can be coupled to the solid-state switch modules 131 and 132 via a connection that provides a switch activation signal 125. The switch control electronics 120 can be adapted to operate the solid-state switch modules 131 and 132 via switch activation signal 125, in order to selectively decouple and recouple the first and second electrical connections 111A, 111B and 112A, 112B, thereby selectively decoupling the selectively decouplable circuit element(s) 140.

In the illustrated embodiment, the AC voltage generator 110A, the controller 105, the switch control electronics 120, and the selectively decouplable circuit element(s) 140 are all connected to a system ground 150.

Figure 3:
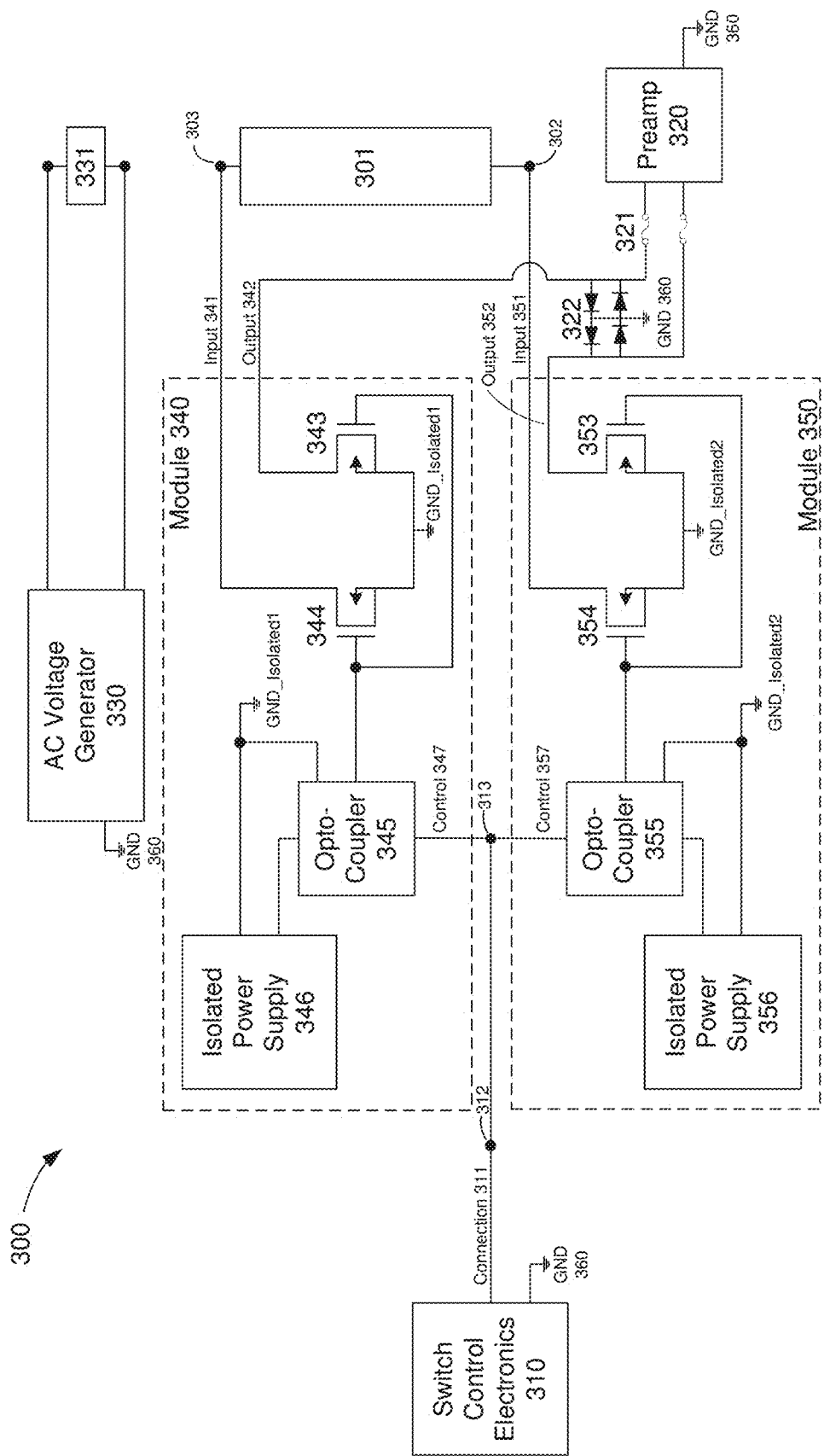
FIG. 3 illustrates an example circuit including isolated solid-state switches, the isolated solid-state switches comprising back-to-back FETs and isolated gate drive electronics, in accordance with various aspects and embodiments of the subject disclosure.
Figure 4:
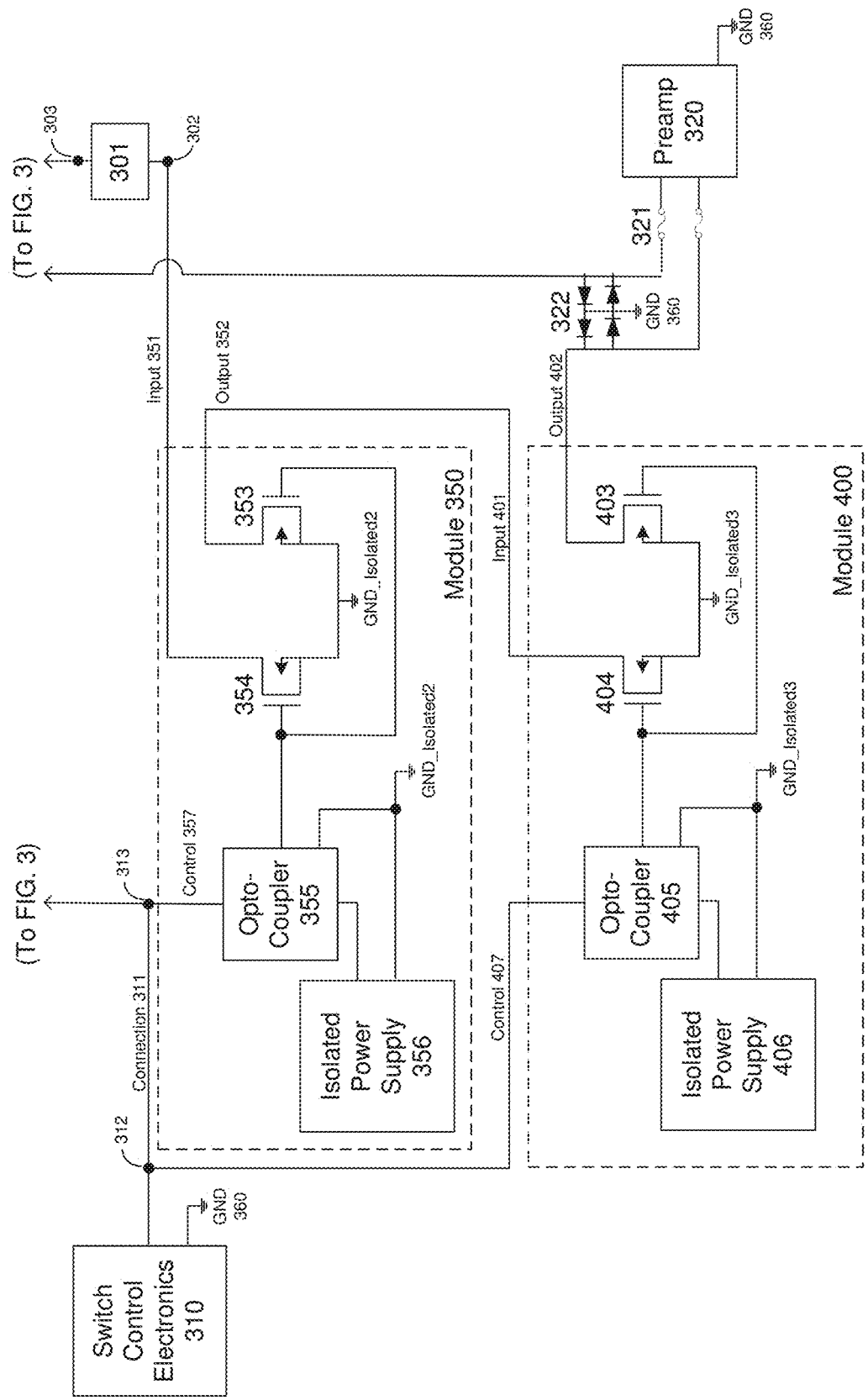
FIG. 4 illustrates a portion of the example circuit introduced in FIG. 3 with a second isolated solid-state switch in series the first, in accordance with various aspects and embodiments of the subject disclosure.

Internal to each of the solid-state switch modules 131, 132 can be a pair N-channel FETs in a back-to-back configuration, e.g., as illustrated further in FIG. 3 and FIG. 4. An individual N-channel FET can have a drain connection, a source connection, a gate connection, and an internal body diode. If a voltage applied to the drain of an N-channel FET is less than a voltage applied to the source of the FET (i.e. the drain-to-source voltage is negative), the FET can conduct current from the source to the drain, regardless of the voltage at the gate. If the voltage applied to the drain of an N-channel FET is greater than the voltage applied to the source of the FET (i.e. the drain-to-source voltage is positive), the FET can only conduct current if the gate-to-source voltage is above the gate threshold voltage. In a back-to-back configuration, the source of both FETs in the pair are connected together, resulting in an AC solid-state switch that can only conduct current when the gate-to-source voltage applied to both FETs is above the gate threshold voltage.

As illustrated further in FIG. 3 and FIG. 4, the switch activation signal 125 can be be directly connected to the gates of the back-to-back FET pairs inside the solid solid-state switch modules 131, 132. In a preferred embodiment, each solid-state switch module 131, 132 can contain an isolated gate driver, connected between the switch activation signal 125 and gates of back-to-back FET pairs. With an isolated gate driver, the switch activation signal 125 can activate the FETs to turn on without requiring a direct electrical connection between the FET source and the system ground 150 or between the FET gate and the switch activation signal 125.

The controller 105 can be coupled to an AC voltage generator 110A via a control connection 107. The AC voltage generator 110A can be directly or indirectly (e.g. inductively) coupled, via direct or inductive link 117, to the AC voltage element 110B. The AC voltage element 110B provides a source of AC voltage at the connection terminals 1 and 2 coupled to the first electrical connection 111A and the second electrical connection 112A. The controller 105 can be adapted to operate the AC voltage generator 110A via control connection 107, thereby creating a voltage on the AC voltage element 110B via direct or inductive link 117 between the AC voltage generator 110A and the AC voltage element 110B.

The controller 105 can also be coupled with the switch control electronics 120 via a switch control signal 115. The controller 105 can be adapted to provide switch control signal 115 to the switch control electronics 120 via a switch signal connection, thereby allowing the switch control electronics 120 to synchronize timing of the solid state switch modules 131 and 132 with reference to timing of the voltages present on the AC voltage element 110B. For example, the switch control electronics 120 can be adapted to decouple/isolate the selectively decouplable circuit element(s) 140 when the AC voltage generator 110A is activated (i.e. when there is a large voltage on the terminals of the AC voltage element 110B), and reconnect/recouple the selectively decouplable circuit element(s) 140 when the AC voltage generator 110A is deactivated (i.e. when there is not a large voltage on the AC voltage element 100B).

In some embodiments, the solid-state switch modules 131, 132 may be implemented in parallel between two electrical lines that are connected to other circuit elements. Solid-state switch modules placed in parallel may be operated with switch control electronics 120 to create a short between to the two electrical lines at selected times. Such embodiments may be useful, for example to short circuit and eliminate noise present as a voltage differential between the two electrical lines.

In FIG. 1, either or both solid-state switch modules 131, 132 can comprise one or more back-to-back FET pairs, for example as illustrated in FIG. 3 and FIG. 4. When multiple back-to-back FET pairs are used, the back-to-back FET pairs can be connected in series, each with independent isolated gate drive electronics. The terms "solid-state switch module" and "back-to-back FET pair" can both be used herein to refer to similar components, however, a solid-state switch module need not necessarily include a back-to-back FET pair, and a back-to-back FET pair need not necessarily include all the elements of a solid-state switch module.

When solid-state switch modules 131, 132 include back-to-back FET pairs, the individual FETs used in the solid-state switch modules 131, 132 can each have a small on-resistance, also specified as the resistance drain-to-source-on ($R_{DS,On}$). A small $R_{DS,ON}$ is favorable as it will add only a small amount of resistive noise into the circuit 100.

In some embodiments, the FETs included in solid-state switch modules 131, 132 can each have a high maximum voltage rating between the drain and source ($V_{DS}$). A FET with a high maximum $V_{DS}$ rating may be favorable, for example, to provide high standoff voltage when the AC voltage element 110B creates a high voltage at the first or second electrical connection 111A, 112A. If a voltage of the circuit 100 were to exceed a maximum $V_{DS}$ rating for a FET, the FET may exhibit breakdown or fail in a shorted or open state. The FET may optionally be protected from damage by using a transient voltage suppressor between the drain and source and/or between the gate and source, e.g., as described with reference to FIG. 10.

In some embodiments, the FETs included in solid-state switch modules 131, 132 may have a short switching time, which depends on the gate-to-source charge. In some embodiments, the FETs can have a low $R_{DS,on}$, high maximum $V_{DS}$ standoff voltage rating, and a fast switching time. FET types for use in solid-state switch modules 131, 132 can include, e.g., silicon carbide FETs and/or gallium nitride FETs. An example component is the Wolfspeed SiC C2M0045170D, which has a maximum standoff voltage of 1700 V, an on-resistance of 45 milliohms, and a gate-to-source charge of 44 nanocoulombs.

In some embodiments, a pair of back-to-back FETs included in solid-state switch modules 131, 132 can have a combined on-resistance equal to the sum of $R_{DS,On}$ for each individual FET, and a combined effective standoff-voltage that is the same as the combined maximum $V_{DS}$ rating for each individual FET. In some embodiments, the back-to-back FET pair can provide a combined standoff voltage of one thousand five hundred (1500) volts or more, a switching time of one hundred (100) microseconds or less, and a combined on-resistance of one hundred (100) milliohms or less. In some embodiments, at least one back-to-back FET pair can provide, e.g., an on resistance of two ohms or less, a standoff voltage of six hundred volts or more across the induction coil, and a switching time of one millisecond or less.

In some embodiments, adding multiple solid-state switch modules 131, 132 in series will create a combined element with a combined maximum standoff voltage that is the sum of the maximum standoff voltage for the individual solid-state switch modules 131, 132 and a combined on-resistance that is the sum of the individual solid-state switch modules 131, 132. The maximum standoff voltage can therefore be increased by adjusting the number solid-state switch modules 131, 132 in series between the AC voltage element 110B and the selectively decouplable circuit element(s) 140, wherein adding solid-state switch modules 131, 132 will linearly increase the combined standoff voltage. Some embodiments can be configured to provide effective standoff voltages of, e.g., three thousand (3000) volts or more and a combined on-resistance of two hundred (200) milliohms or less. In some embodiments, multiple back-to-back FET pairs disposed in series can provide, e.g., a combined on resistance of four ohms or less and a combined standoff voltage of twelve hundred volts or more.

The controller 105 can synchronize timing of the solid-state switch modules 131 and 132 with a timing of the AC voltage generator 110A as noted above. For example, the controller 105 can be adapted to operate the solid-state switch modules 131, 132 according to a second timing that is based on a first timing of the AC voltage generator 110A. While the first timing activates and terminates the AC voltage generator 110A to produce a voltage on the AC voltage element 110B, the second timing activates the solid-state switch modules 131, 132 in a manner that is inverse to the AC voltage generator 110A. When the AC voltage generator 110A is active, the solid-state switch modules 131, 132 are deactivated in order to decouple the selectively decouplable circuit element(s) 140. When the AC voltage generator 100A is inactive and there is no high-voltage on the AC voltage element 110B, the solid-state switch modules 131, 132 can be activated in order to reconnect/recouple the selectively decouplable circuit element(s) 140.

The solid-state switch modules 131, 132 can furthermore optionally include isolated gate drive electronics, as illustrated in FIG. 3 and FIG. 4. In embodiments wherein the voltage at the connection terminals 1 and 2 of the AC voltage element 110B are very high and/or the selectively decouplable circuit element(s) 140 are highly sensitive, it can be advantageous to isolate FET gate drive voltages from the AC voltage element 110B as well as from the switch control electronics 120, the controller 105, and the system ground 150. Example electrical isolation components comprise optocouplers, isolated power supplies and independent grounds that can be independent from the system ground 150 which is used by, e.g., the selectively decouplable circuit element(s) 140 and the controller 105.

In some embodiments, multiple independent groups of electrical isolation components can be included, e.g., by using a first independent group of electrical isolation components for a first solid state switch module 131 or back-to-back FET pair, and a second independent group of electrical isolation components for a second solid state switch module 132 or back-to-back FET pair. FIG. 3 and FIG. 4 both illustrate independent groups of electrical isolation components used to isolate different solid state switch modules/back-to-back FET pairs. In FIG. 3, the back-to-back FET pair comprised of FETs 343 and 344 are connected to an isolated gate driver comprising optocoupler 345 and isolated power supply 346, while the back-to-back FET pair comprising FETs 353 and 354 are connected to another isolated gate driver comprising optocoupler 355 and isolated power supply 356.

Figure 2:
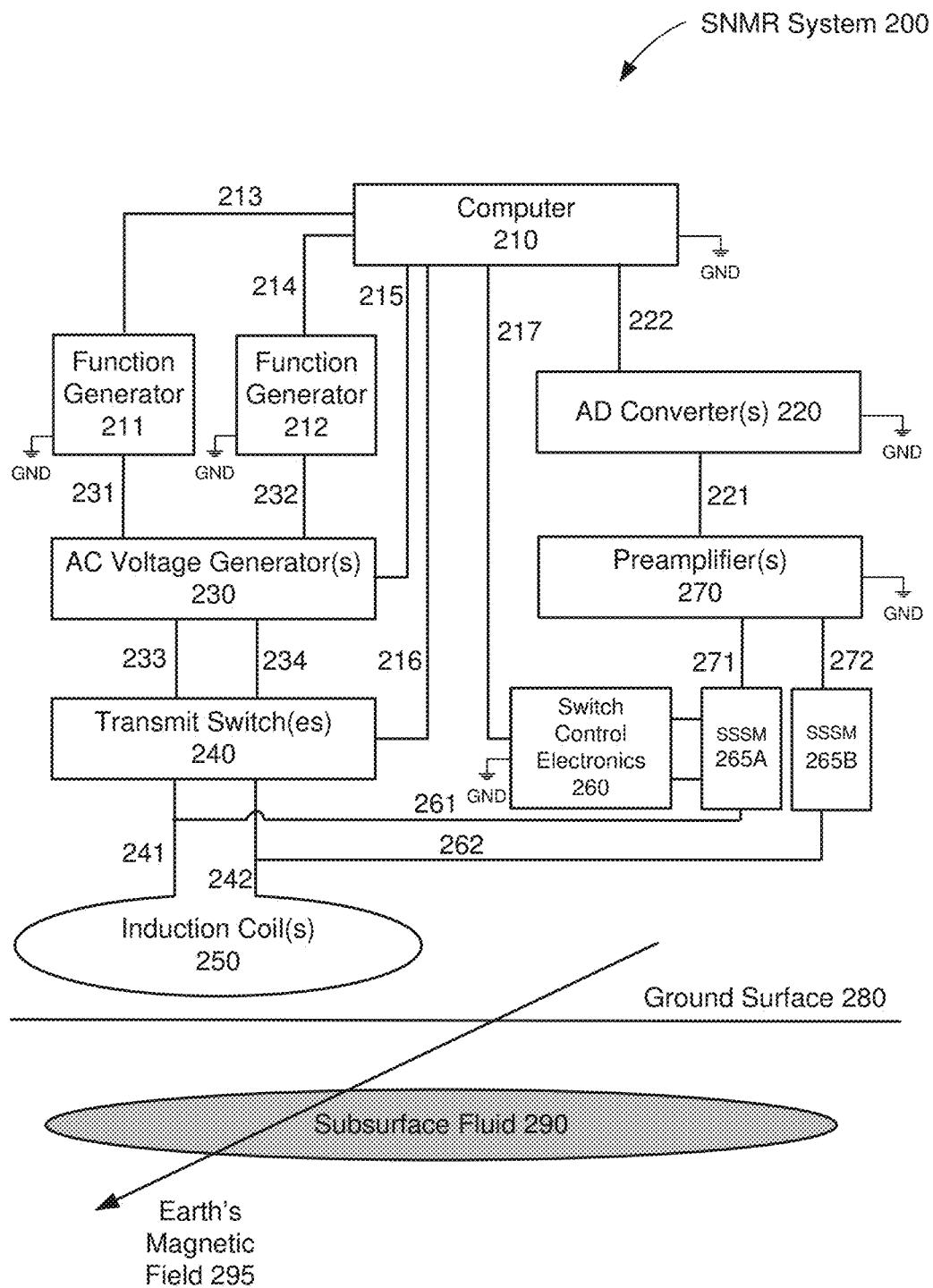
FIG. 2 illustrates an example surface nuclear magnetic resonance (SNMR) system, as one example application of the selective solid-state switch decoupling techniques disclosed herein.

In some embodiments, described further with reference to FIG. 2, a circuit 100 such as illustrated in FIG. 1 can be used in connection with an NMR system or a SNMR system. For example, the AC voltage element 110B can comprise an induction coil for an NMR device. The selectively decouplable circuit element(s) 140 can comprise receive electronics for the NMR device. The switch control electronics 120 can be adapted to operate the solid-state switch modules 131, 132 in order to decouple NMR receive electronics from the induction coil during a transmit stage of the NMR operation and to couple the receive electronics to the induction coil during a receive stage of the NMR operation.

FIG. 2 illustrates an example surface nuclear magnetic resonance (SNMR) system, as one example application of the selective solid-state isolation techniques disclosed herein. The example SNMR system 200 includes a computer 210, function generators 211, 212, AC voltage generator(s) 230, transmit switch(es) 240, induction coil(s) 250, switch control electronics 260, solid-state switch modules (SSSMs) 265A and 265B, preamplifier(s) 270, and Analog to Digital (AD) converter(s) 220. The induction coil(s) 250 are illustrated over a ground surface 280. A subsurface fluid 290 is illustrated beneath the ground surface 280. Earth's magnetic field 295 exists over and under the ground surface 280 and within the subsurface fluid 290.

The example SNMR system 200 is one example of an NMR system which can usefully incorporate the selective solid-state isolation techniques disclosed herein. Other NMR systems, such as Magnetic Resonance Imaging (MRI) systems used in medical applications and borehole NMR systems, as well as other systems that do not necessarily involve NMR, can also incorporate the technologies disclosed herein.

In FIG. 2, the computer 210 is coupled to function generators 211, 212 by connections 213 and 214, respectively. The computer 210 is also coupled to AC voltage generator(s) 230 by connection 215, to transmit switch(es) 240 by connection 216, to gate drive electronics 260 by connection 217, and to AD converter(s) 220 by connection 222. Furthermore, function generators 211, 212 are coupled to AC voltage generator(s) 230 by connections 231 and 232, respectively. AC voltage generator(s) 230 are coupled to transmit switch(es) 240 by connections 233 and 234. Transmit switch(es) 240 are coupled to ends of the induction coil(s) 250 by electrical connections 241 and 242, respectively, or may be passive components such as series crossed diodes. The ends of the induction coil(s) 241 and 242 are coupled to solid state switch modules 265A, 265B by electrical connections 261 and 262, respectively. Solid-state switch modules 265A, 265B are coupled to preamplifier(s) 270 by connections 271 and 272. Preamplifier(s) 270 are coupled to AD converter(s) 220 by connection 221. The illustrated connections between the switch control electronics 260 and the solid-state switch modules 265A, 265B can implement the switch activation signal 125 introduced in FIG. 1.

In general, with regard to FIG. 2, the switch control electronics 260 can implement the switch control electronics 120 introduced in FIG. 1, and the solid-state switch modules 265A, 265B can implement the solid-state switch modules 131 and 132 introduced in FIG. 1. The electrical connections 261 and 271 can implement the first electrical connection 111A, 111B introduced in FIG. 1, and the electrical connections 262 and 272 can implement the second electrical connection 112A, 112B introduced in FIG. 1. Furthermore, the AC voltage generator(s) 230 can implement the AC voltage generator 110A introduced in FIG. 1, the induction coil(s) 250 can implement the AC voltage element 110B introduced in FIG. 1, the preamplifier(s) 270 and AD converter(s) 220 can implement the selectively decouplable circuit element(s) 140 introduced in FIG. 1, and the computer 210 can implement the controller 105 introduced in FIG. 1.

In an example embodiment, SNMR system 200 can be configured to produce electrical current pulse sequences on the induction coil(s) 250. Each electrical current pulse sequence can comprise one or more oscillating electrical current pulses. When a pulse sequence comprises more than one pulse, the pulses may be separated by a pulse separation time. Also, pulse sequences can be separated by a pulse sequence separation time.

In some embodiments, the induction coil(s) 250 can optionally comprise transmit-only induction coil(a) and receive-only induction coil(s). The receive-only induction coil(s) may be deployed without direct connection to the AC voltage generator(s) 230 or transmit switches(s) 240 for the purpose of receiving NMR signal voltages or background noise voltages. In such embodiments, large voltages may still be inductively coupled onto the receive-only induction coil(s). Using solid-state switch modules 265A, 265B at the terminals of the receive-only induction coil(s) can provide protection for preamplifier(s) 270 and AD converter(s) 220 used to measure the NMR signal or background noise voltages on the receive-only induction coil(s).

The computer 210 can be configured to produce a pulse by selecting a pulse phase, and activating the AC voltage generator(s) 230. The computer 210 may be configured to select a pulse phase for example by activating a function generator 211 or 212 corresponding to a desired pulse phase, so that the selected function generator 211 or 212 provides an input pulse phase to the AC voltage generator(s) 230, which is then amplified by the AC voltage generator(s) 230 to produce a corresponding pulse on the induction coil(s) 250. The computer 210 may also optionally be configured to close one or more transmit switch(es) 240 when activating the AC voltage generator(s) 230 and open the transmit switch(es) 240 after activating the AC voltage generator(s) 230. In some embodiments, switch control electronics and solid-state switch modules can be used to implement the transmit switch(es) 240, similar to the use of switch control electronics 260 and solid-state switch modules 265A, 265B to implement receive switches. The use switch control electronics and solid-state switch modules as transmit switch(es) 240 can be instead of, or in addition to, the switch control electronics 260 and solid-state switch modules 265A, 265B illustrated in FIG. 2.

The computer 210 may be configured to produce a pulse sequence by producing a first pulse, then if additional pulses are included in the sequence, waiting for a predetermined pulse separation time, and then producing a next pulse, and repeating until the pulse sequence is complete. The computer 210 may be configured to produce two or more pulse sequences by producing a first pulse sequence, then waiting for a predetermined pulse sequence separation time, then producing a next pulse sequence, and repeating until a desired number of pulse sequences are complete.

The SNMR system 200 may also be configured to receive and record NMR signal data received via the induction coil(s) 250. The SNMR system 200 may be configured to receive and record NMR signal data after one or more pulses within a pulse sequence, and/or after completion of a pulse sequence. In some embodiments, the computer 210 may be configured to provide a switch control signal via connection 217 and/or otherwise operate the switch control electronics 260 and solid-state switch module 265A, 265B in order to decouple, during a pulse, the electrical connections 261 and 271, as well as the electrical connections 261 and 271. The computer 210 may be configured to operate the switch control electronics 260 and solid-state switch modules 265A, 265B in order to reconnect/recouple, after the pulse, the electrical connections 261 and 271, as well as the electrical connections 262 and 272. In other words, the computer 210 may be configured to operate the switch control electronics 260 and solid-state switches 265A, 265B to selectively isolate the preamplifier(s) 270 and AD converter(s) 220 during transmit stage electrical pulses.

The preamplifier(s) 270 amplify desired and undesired signals received via induction coil(s) 250. The AD converter(s) 220 convert the received and amplified signals to digital NMR signal data, e.g. by sampling received signals at a desired sampling rate, and the computer 210 or other device equipped with storage media may be configured to store the digital NMR signal data. Instrument switching artifacts are one type of undesired signal that may interfere with SNMR measurements. By employing the switch control electronics 260 and solid-state switch modules 265A, 265B, the SNMR system 200 can reduce instrument switching artifacts associated with the use of traditional relay switches.

In some embodiments, the computer 210 may be configured to process detected NMR signal data, e.g., to combine NMR signal data received and recorded after one or more pulses within a pulse sequence, and/or received and recorded after completion of pulse sequences, in such a way that preserves desired NMR signal data and cancels undesired NMR signal data. It will be appreciated that while the computer 210 may be configured to perform SNMR processing, in some embodiments SNMR acquisition and SNMR processing may be performed separately, e.g., by first performing SNMR acquisition with a SNMR system 200, then processing acquired SNMR data at a later time and/or with a different computing device.

In some embodiments, computer 210 may be programmed with software that controls the generation of pulse sequences and the acquisition of data. A set of data acquisition devices may comprise devices configured generate the control signals for the pulse sequences, such as function generators 211, 212, and AD converter(s) 220 that receive, convert and/or record SNMR signals. The AC voltage generator(s) 230 may be configured to generate one or more current pulses in the induction coil(s) 250 in a transmit mode, to induce a coherent precession of NMR spins in the subsurface fluid 290. Optional transmit switch(es) 240 may be configured to isolate transmitter noise from the receive circuitry during a receive mode. Induction coil(s) 250 may be arranged on or above the surface of the Earth 280, and may be configured to cause a coherent precession of spins in the subsurface fluid 290 in the Earth's magnetic field 295 and also to detect the NMR magnetic fields generated by the coherent precession of spins in the subsurface fluid 295. Switch control electronics 260 and solid-state switch modules 265A, 265B may be configured to isolate the receive preamplifier(s) 270 from the potentially large voltage on the induction coil(s) 250 during transmit mode. Optional preamplifier(s) 270 may be configured to amplify the detected NMR signals prior to digitization by the AD converter(s) 220. The optional transmit switch(es) 240 may comprise active devices such as relays, and/or passive devices such as diodes. Optional tuning capacitors, not shown in FIG. 2, may be used in the transmit mode to increase the transmitted current in the induction coil(s) 250, and/or in receive mode to increase the amplitude of the NMR signal voltage across the terminals of the induction coil(s) 250.

In some embodiments, induction coil(s) 250 may comprise an array of coils comprising one or more transmit coils, one or more receive coils, and/or one or more combination transmit and receive coils. For example, induction coil(s) 250 may comprise one transmit coil and multiple receive coils. Induction coil(s) 250 may comprise one combination transmit and receive coil, and multiple receive coils. Induction coil(s) 250 may comprise multiple combination transmit and receive coils. These and other multicoil arrangements may be configured in some embodiments as will be appreciated. Multicoil arrangements are useful for localization of subsurface fluids 290, as described for example in U.S. Pat. No. 7,466,128, which is incorporated by reference. Regardless of the arrangement of induction coil(s) 250, the electrical connections 261 and 262 remain coupled, either directly or inductively, with induction coil(s) 250 used in the transmit stage. The term "coupled" as used herein encompasses both direct and indirect (e.g., inductive) coupling.

Any combination of hardware and software that enables the acquisition and processing of NMR signals from subsurface liquids in the Earth's magnetic field is suitable to implement SNMR embodiments of this disclosure. An architecture to implement the disclosed methods could comprise, for example, elements illustrated in FIG. 2, such as an AC voltage generator(s) 230, a digital control system implemented at least in part by computer 210, a transmit switching circuit including transmit switch(es) 240, a receive switching circuit including switch control electronics 260 and solid-state switch modules 265A, 265B, a multi-channel receive circuit including, e.g., a plurality of induction coils 250, preamplifier(s) 270, a digital acquisition system including AD converter(s) 220, a digital storage device which may be implemented within computer 210 or other digital storage device, and a digital computer 210 equipped with pulse sequence control software and/or SNMR processing software. The switching circuits may transition a system such as 200 between a transmit-mode, when the coil(s) 250 are connected to the transmit circuit, and receive-mode when the coil(s) 250 are connected to the receive circuit. In a single acquisition sequence, the transmit circuit directs an AC current pulse or pulses with controlled amplitude and phase (alternating at the Larmor frequency) through the induction coil(s) 250 in short succession. As quickly as possible after a given transmit pulse, and before the next pulse, the switching circuits may transfer the induction coil(s) 250 into a single- or multi-channel receive circuit. The data acquisition system may then record the voltages on the receive circuit (including the surface coil(s) 250), and may record this received NMR signal data following the transmit pulse on the digital storage device. To form a complete cycled set, an acquisition sequence may be repeated one or more times, changing the phase of one or more transmit pulses between each acquisition sequence. After a complete cycled set corresponding to a NMR measurement is acquired, the signals recorded from each acquisition sequence may be linearly combined through digital processing.

In general, a SNMR measurement may be collected by transmitting one or more pulses of alternating current through a wire loop on the Earth's surface. The alternating current may be tuned to the Larmor frequency of hydrogen nuclei and may generate a magnetic field in the subsurface beneath the coil(s) alternating at the Larmor frequency. The alternating magnetic field radiates into the Earth and modifies the nuclear magnetization state of hydrogen present in fluids at depth. At equilibrium, the net nuclear magnetization is aligned with Earth's background magnetic field along the so-called longitudinal axis. The transmitted alternating magnetic field perturbs the magnetization from this equilibrium alignment so that some component of the nuclear magnetization rotates into the transverse "xy" plane. Once rotated from equilibrium, the magnetization relaxes over time back to the equilibrium state over time, decaying from the transverse plane and re-growing along the longitudinal axis. The rotation of the magnetization by the transmitted pulse(s) and subsequent relaxation to equilibrium are described by the phenomenological Bloch equations. The evolution of the magnetization under the Bloch equations depends on several variables including the amplitude of the transmitted field, the duration and timing of the transmitted field, the phase of the transmitted field, the longitudinal relaxation time T1, FID relaxation rate T2*, and/or the spin-spin relaxation time T2 of the hydrogen nuclei under investigation.

An NMR signal is generated by the presence of coherent transverse magnetization following a transmit pulse. The transverse magnetization generates a magnetic field, which oscillates at the Larmor frequency, and generally has a phase related to the phase of one or more of the transmitted pulses. The SNMR instrumentation records the NMR signal by monitoring the voltage on the surface loop. Identical measurements may be repeated to improve signal to noise; measurements using varied transmit currents may be used to modulate the contribution of signals from groundwater at different depths. Spatial inversion techniques may be used to isolate NMR signal contributions from different depth ranges or different locations in a 2D or 3D model of the subsurface, as described in U.S. Pat. No. 7,466,128.

FIG. 3 illustrates an example circuit including solid-state isolation of circuit elements, in accordance with various aspects and embodiments of the subject disclosure. FIG. 3 includes example circuit 300. The example circuit 300 includes an AC voltage generator 330 and a transmit coil 331. A receive coil 301 is inductively coupled with the transmit coil 331, or may be coupled directly to the transmit coil 331, or may be the same as the transmit coil 331. A first solid-state switch module 340 comprising a pair of back-to-back FETs 343, 344 is positioned between a first side of the receive coil 301 and a first input to a differential preamplifier 320. A second solid-state switch module 350 comprising a pair of back-to-back FETs 353, 354 is positioned between the other side of the receive coil 301 and a second input to the differential preamplifier 320. The first pair of back-to-back FETs 343, 344 can be operated via a first set of isolated gate drive electronics, and the second pair of back-to-back FETs 353, 354 can be operated via a second set of isolated gate drive electronics as illustrated in FIG. 3 to selectively isolate the preamplifier 320 from the receive coil 301. Crossed diodes 322 coupled with a ground 360 and fuses 321 can further protect the preamplifier 320 from large voltages at the receive coil 301 during transmit by the transmit coil 331.

Gate drive electronics illustrated in FIG. 3 include a switch control connection 311 connecting the switch control electronics 310 to the isolated gate drive electronics of the solid-state switch modules 340, 350. Each solid-state switch module 340, 350 can have separate isolated gate drive electronics comprised of an optocoupler 345, 355 and an isolated power supply 346, 356. In some embodiments, the isolated power supplies 346, 356 can comprise DC-DC converters. In other embodiments the isolated power supplies 346, 356 can comprise batteries. The optocouplers 345, 355 respond to the switch control signal received via connection 311 by applying a voltage from the isolated power supplies 346, 356 to the gates of FETs 343, 344 or 353, 354, thereby turning on the solid-state switch modules 340, 350.

FIG. 3 illustrates each solid-state switch module 340, 350 as coupled to the switch control electronics 310 by an independent isolated gate driver. The gate driver for module 340 is comprised of the isolated power supply 346 and opto-coupler 345, while the gate driver for module 350 is comprised of an isolated power supply 356 and optocoupler 355. Use of separate isolated gate drivers allows control of the back-to-back FET pairs without connecting the source pins of the FETs to the system ground 360, and without connecting gates for the first pair of FETs 343, 344 to gates for the second pair of FETs 353, 354. The first pair of back-to-back FETs 343, 344 and the second pair of back-to-back FETs 354, 353 can be operated at the same time via the control connection 311 from the switch control electronics 310, to selectively isolate the preamplifier 320 from the receive coil 301.

In the illustrated example, each pair of back-to-back FETs 343, 344 and 353, 354 is associated with a different set of electrical isolation components: optocoupler 345, isolated power supply 346, and isolated ground GND_Isolated1 are associated with the first pair of back-to-back FETs 343, 344, and optocoupler 355, isolated power supply 356, and isolated ground GND_Isolated2 are associated with the second pair of back-to-back FETs 353, 354. FIG. 3 thus illustrates electrically isolated gate drive electronics connected to different isolated electrical grounds GND_Isolated1 and GND_Isolated2, wherein the different electrical grounds are also different from the system ground 360 used by the AC voltage generator 330, the preamplifier 320 and the switch control electronics 310. This configuration allows control of the back-to-back FET pairs without connecting the source pins of the FETs to the system ground 360 and without connecting gates for the first pair of FETs 343, 344 to gates for the second pair of FETs 353, 354.

In the context of FIG. 3, if the individual FETs can operate to an example maximum $V_{DS}$ of 1700V, the preamp inputs can be protected if there is a voltage differential of +/−3400V across the induction coil 301. If one end of the induction coil (node 303) is at +1700V relative to the system ground 360 and the other end (node 302) is at −1700V relative to the system ground 360, no FET exceeds its maximum rated $V_{DS}$. In this condition, GND_Isolated1 will also have a voltage of +1700V relative to node 303 and will have a differential voltage of +3400 relative to GND_Isolated2 and node 302. If all of the FETs were controlled by a direct connection to the switch control electronics 310 and system ground 360, this voltage standoff would not be possible and the two ends of the induction coil 301 would be shorted to the system ground 360.

In FIG. 3, the switch control electronics 310 can provide a switch control signal, received as control 347 and control 357, wherein the switch control signal can be synchronized with transmit pulses generated at the transmit coil 331. The switch control signal can comprise, e.g. a signal received from computer 210 illustrated in FIG. 2. The switch control electronics 310 can time activation and deactivation of the first and second back-to-back FET pairs 343, 344 and 353, 354 using the switch control signal. The switch control electronics 310 can apply an activation voltage causing all FETs to turn on, thereby coupling the input 341 with the output 342, and coupling the input 351 with the output 352, and correspondingly coupling the receive coil 301 and the preamp 320 during receive mode (i.e. after a transmit pulse by transmit coil 331), so that small voltages on the induction coil 301 can be recorded. The switch control electronics 310 can remove the activation voltage to decouple the receive coil 301 from the preamp 320 during transmission of electrical pulses by transmit coil 331.

In FIG. 3, the solid-state switch modules 340 and 350 may be implemented using discrete components, such as discrete FETs, opto-couplers, and isolated power supplies, or may instead be implemented using integrated circuit (IC) packages that incorporate a back-to-back FET pair and electrically isolated optical gate control. Such IC packages are sometimes referred to as AC solid-state relays. One example IC package is the Panasonic PhotoMOS AQV209G, which provides a standoff voltage of 1,200 V, an on-resistance of 1 ohm, and typical switching times of 500 ms.

FIG. 4 illustrates a portion of the SNMR circuit introduced in FIG. 3 with an additional solid-state switch module, in accordance with various aspects and embodiments of the subject disclosure. FIG. 4 includes the second solid-state switch module 350, switch control electronics 310, isolated power supply 356, optocoupler 355, isolated ground GND_Isolated2, receive coil 301, second pair of back-to-back FETs 353, 354, preamplifier 320, crossed diodes 322 coupled with a ground GND and fuses 321, introduced in FIG. 3. The other elements of FIG. 3 such as the transmit coil 331 and the first solid-state switch module 340 are not included in FIG. 4 for simplicity of illustration, however the other elements of FIG. 3 can also be included in FIG. 4.

FIG. 4 furthermore includes an additional solid-state switch module 400 in series with the second solid-state switch module 350. The additional solid-state switch module 400 includes a third pair of back-to-back FETs 403, 404 and an additional set of electrical isolation components including optocoupler 405, isolated power supply 406, and isolated ground GND_Isolated3. The connection 302 to the receive coil 301 passes to the input 351 of the solid-state switch module 350, the output 352 of module 350 passes to the input 401 of solid-state switch module 400, and the output 402 of solid-state switch module 400 is connected to an input of the preamplifier 320. The solid-state switch module 350 is therefore supplemented by another solid-state switch module 400 that is placed in series. The solid-state switch module 400 can be controlled by a switch control signal received as control 407. The series combination illustrated as the second solid-state switch module 350 in series with the solid-state switch module 400 may be referred to herein as a series combination of back-to-back FET pairs or a series combination of solid-state switch modules.

In the illustrated example, each back-to-back FET pair such as 403, 404 can be associated with a different set of gate drive electronics providing electrical isolation of the gate control and grounds: optocoupler 405, isolated power supply 406, and isolated ground GND_Isolated3 are associated with the back-to-back FET pair 403, 404, and optocoupler 355, isolated power supply 356, and isolated ground GND_Isolated2 are associated with the back-to-back FET pair 353, 354. In this illustrated configuration, solid-state switch modules 350 and 400 may be referred to as a series combination of isolated solid-state switch modules 350, 400 or a series combination of isolated back-to-back FET pairs.

The series combination of back-to-back FET modules illustrated in FIG. 4 can provide a doubling of the effective maximum standoff voltage between electrical connections. As an example, if each FET in FIG. 4 has a maximum $V_{DS}$ rating of 1700 V, a single solid-state switch module 350 can standoff 1700 V between its input 351 and output 352. With the same example maximum $V_{DS}$ rating of 1700 V, the series combination of solid-state switch modules can standoff 3400V, e.g. between input 351 and output 402. In this example, the series combination of isolated solid-state switch modules can operate with a maximum voltage swing of 3400V between one side of the receive coil 302 and the system ground 360 and between one side of the receive coil 302 and a preamp input.

FIG. 4 shows a circuit similar to the circuit 300 introduced in FIG. 3, with a difference in the number of back-to-back FET pairs which are employed. Otherwise, the operation of the example circuit illustrated in FIG. 4 can be similar to the operation of the circuit 300 illustrated in FIG. 3.

Similar to FIG. 3, the solid-state switch modules 350, 400 can be operated via switch control electronics 310 illustrated in FIG. 4 to selectively isolate the preamplifier 320 from the receive coil 301. Crossed diodes 322 coupled with a ground 360 and fuses 321 can further protect the preamplifier 320 from large voltages at the receive coil 301 during transmit by the transmit coil 331.

While not illustrated in FIG. 4, the first solid-state switch module 340 from FIG. 3 can be similarly supplemented with an additional solid-state switch module similar to the additional solid-state switch module 400. Also, further replications of additional solid-state switch module 400 can optionally be added in series with either the first solid-state switch module 340 or the second solid-state switch module 350 with three, four, or more modules in a group if desired for particular embodiments.

With reference to both FIG. 3 and FIG. 4, embodiments of this disclosure can include different numbers of back-to-back FET pairs. Some embodiments can include a single pair of back-to-back FETs on each side of a receive coil, as illustrated in FIG. 3. Other embodiments can include multiple back-to-back FET pairs in series on a side of the receive coil, as illustrated in FIG. 4. Two or more back-to-back FET pairs can be arranged in series on each side of the receive coil.

In an example embodiment, a series combination of two isolated back-to-back FET modules may be placed between one receive coil terminal 302 and one input to a differential preamp, while a series combination of two isolated back-to-back FET modules is also placed between a second receive coil terminal 303 and the second input to the differential preamp. In such an embodiment, there are effectively four isolated back-to-back FET pairs between the two terminals of the receive coil 301, allowing an effective voltage stand-off four times larger than the maximum voltage standoff rating of an individual FET. Such an embodiment may be referred to as a differential coil with a series combination of two solid-state switch pairs on each side of the coil. For a differential coil with a series combination of two solid-state switch pairs on each side of the coil, if each FET has a maximum $V_{DS}$ rating of 1700V, the effective series combination of four back-to-back FET pairs between the two coil terminals 302, 303 can provide a voltage standoff of 6200V and can protect the preamp 320 from very high coil voltages during pulse transmit.

In an example embodiment, a series combination of two isolated back-to-back FET modules may be placed between one receive coil terminal 302 and the ungrounded input of a single-ended preamp, and the second receive coil terminal 303 may be connected to the ground of the single-ended preamp. In such an embodiment, there are effectively two isolated back-to-back FET modules between the two terminals of the receive coil, allowing an effective voltage standoff two times larger than the maximum voltage standoff rating of an individual FET. Such an embodiment may be referred to as a single-ended coil with a series combination of two solid-state switch pairs on the ungrounded side of the coil.

Some embodiments can include different numbers of isolated back-to-back FET pairs on different sides of the receive coil. For example, some embodiments may use one or more back-to-back FET pairs on one side of a receive coil, without using any back-to-back FETs on the other side of the receive coil. Other embodiments my use one pair back-to-back FETs on one side of a receive coil, while using two or more back-to-back FET pairs on the other side of the receive coil. Any combination of different numbers of back-to-back FETs is possible in accordance with FIG. 4.

Figure 5:
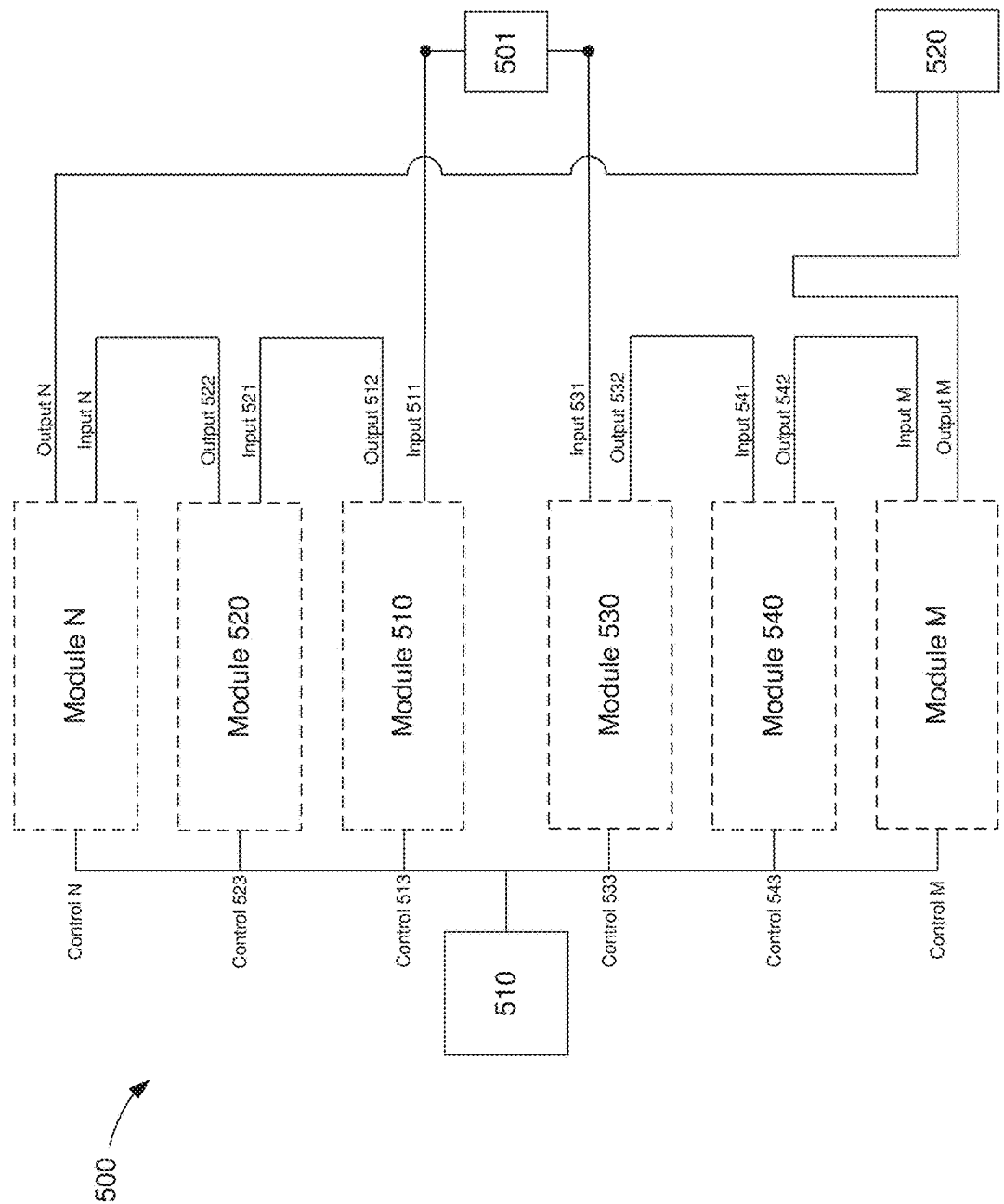
FIG. 5 illustrates multiple solid-state switch modules in series on both sides of an AC voltage element, in accordance with various aspects and embodiments of the subject disclosure.

FIG. 5 illustrates multiple solid-state switch modules in series on both sides of an AC voltage element, in accordance with various aspects and embodiments of the subject disclosure. FIG. 5 includes switch control electronics 510, an AC voltage element 501, and selectively decouplable circuit element(s) 520. A first example set of solid-state switch modules comprising modules 510, 520, N is positioned in series between a first side of the AC voltage element 501 and the selectively decouplable circuit element(s) 520. A second example set of solid-state switch modules comprising modules 530, 540, M is positioned in series between a second side of the AC voltage element 501 and the selectively decouplable circuit element(s) 520.

Each of the illustrated solid-state switch modules is controlled by a respective control signal from the switch control electronics 510. A control 513 controls solid-state switch module 510. A control 523 controls solid-state switch module 520. A control N controls solid-state switch module N. A control 533 controls solid-state switch module 530. A control 543 controls solid-state switch module 540. A control M controls solid-state switch module M.

Also, each of the solid-state switch modules comprises an input and an output. Solid-state switch module 510 comprises input 511 and output 512, wherein input 511 connects to the first side of the AC voltage element 501 and the output 512 connects to input 521. Solid-state switch module 520 comprises input 521 and output 522, wherein input 521 connects to the output 512 and the output 522 connects to input N. Solid-state switch module N comprises input N and output N, wherein input N connects to the output 522 and the output N connects to a first input of the selectively decouplable circuit element(s) 520.

Similarly, solid-state switch module 530 comprises input 531 and output 532, wherein input 531 connects to the second side of the AC voltage element 501 and the output 532 connects to input 541. Solid-state switch module 540 comprises input 541 and output 542, wherein input 541 connects to the output 532 and the output 542 connects to input M. Solid-state switch module M comprises input M and output M, wherein input M connects to the output 542 and the output M connects to a second input of the selectively decouplable circuit element(s) 520.

In FIG. 5, each solid-state switch module 510, 520, N, 530, 540, M is controlled by a switch activation signal. Each switch activation signal may be controlled by separate switch control electronics or may be synchronized to a shared switch control electronics 510. The AC voltage element 501 is a source of AC voltage. One terminal of the AC voltage element 501 may be connected through a series combination of more than two isolated back-to-back FET modules to one connection of a selectively decouplable circuit element 520. A second terminal of the AC voltage element 501 may be connected through a series combination of more than two isolated back-to-back FET modules to another input of the selectively decouplable circuit element 520. The use of multiple isolated back to back FET modules provides the ability to stand off large AC voltages that may be present between two terminals of the AC voltage element 501, to protect the selectively decouplable circuit element 520 from high voltages that are present on the terminals of the AC voltage element 501, and to connect the selectively decouplable circuit element 520 to the terminals of the AC voltage element 501 when the voltage levels are within an acceptable operating range for the selectively decouplable circuit element 520.

Figure 6:
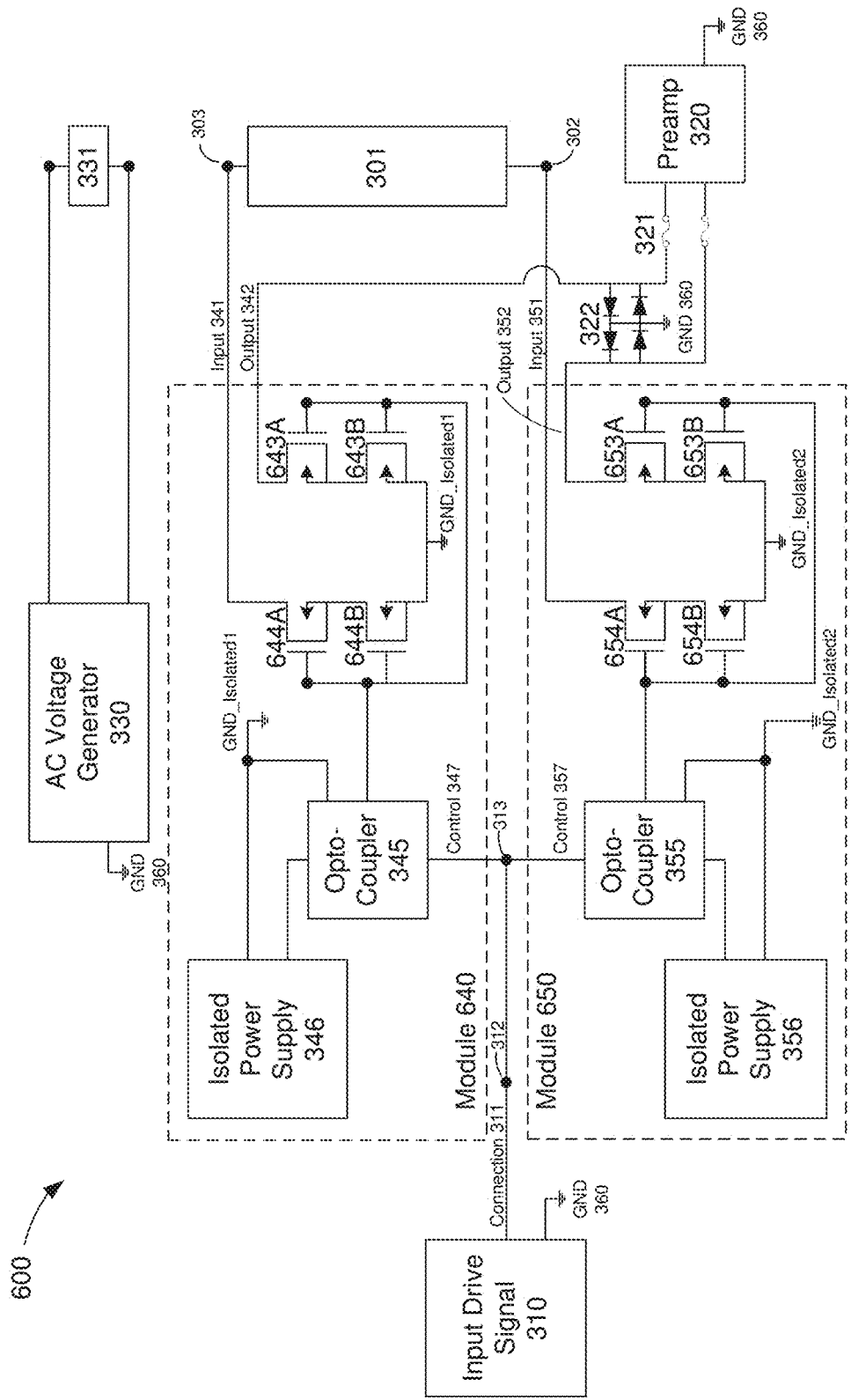
FIG. 6 is a circuit diagram similar to FIG. 3, where each FET is replaced by two FETs in series, in accordance with various aspects and embodiments of the subject disclosure.

FIG. 6 is a circuit diagram similar to FIG. 3, where each FET is replaced by two FETs in series, in accordance with various aspects and embodiments of the subject disclosure. The FETs in series are facing the same direction (i.e. attached between the source and drain). FET 343 of FIG. 3 is replaced by FET 643A and FET 643B, where the source of FET 643A is connected to the drain of FET 643B. FET 344 of FIG. 3 is replaced by FET 644A and FET 644B. where the source of FET 644A is connected to the drain of FET 644B. FET 353 of FIG. 3 is replaced by FET 653A and FET 653B, where the source of FET 653A is connected to the drain of FET 653B. FET 354 of FIG. 3 is replaced by FET 654A and FET 654B, where the source of FET 654A is connected to the drain of FET 654B.

Figure 7:
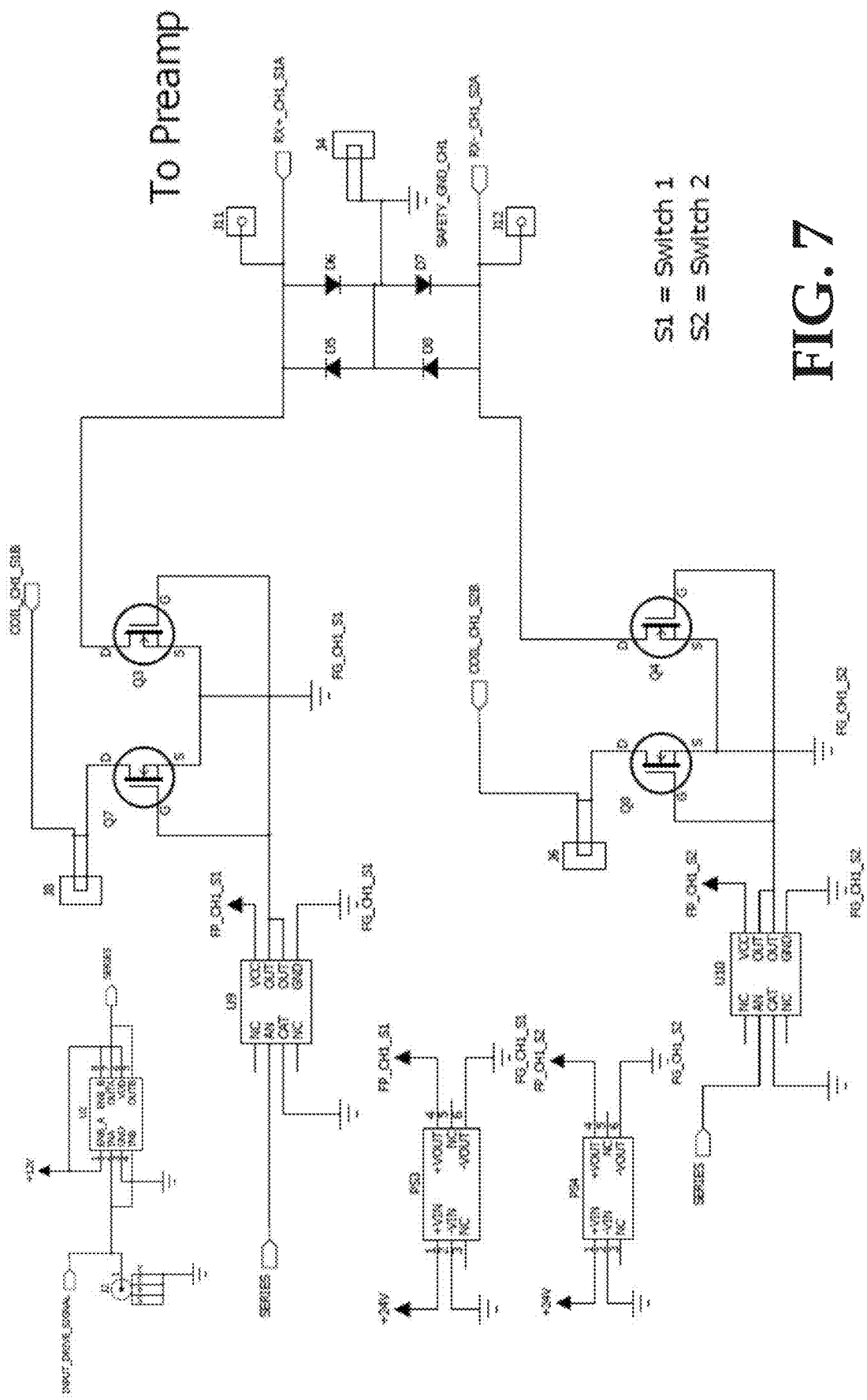
FIG. 7 is a detailed circuit diagram showing components of an example SNMR circuit including isolated back-to-back FET pairs as solid-state switches, in accordance with various aspects and embodiments of the subject disclosure.

FIG. 7 is a detailed circuit diagram showing components of an example SNMR circuit including isolated back-to-back FET pairs as switches, in accordance with various aspects and embodiments of the subject disclosure. The connection labelled "COIL_CH1_S1B" is the connection to the first terminal of the receive coil and passes through "S1=Switch 1" to the differential preamp (+) input labelled "RX+_CH1_S1A". The connection labelled COIL_CH1_S2B is the connection to the second terminal of the receive coil and passes through "S2=Switch 2" to the differential preamp (−) input labelled "RX−_CH1_S2A." Switch 1 has isolated gate drive electronics that include optocoupler "U9," isolated power supply "PS3," and isolated ground "FG_CH1_S1." Switch 2 has isolated gate drive electronics that include optocoupler "U10," isolated power supply "PS4", and isolated ground "FG_CH1_S2." Both switches are controlled by switch control electronics "U2" that provide a switch activation signal "SERIES" connected to both isolated gate drive circuits through the optocouplers.

Figure 8:
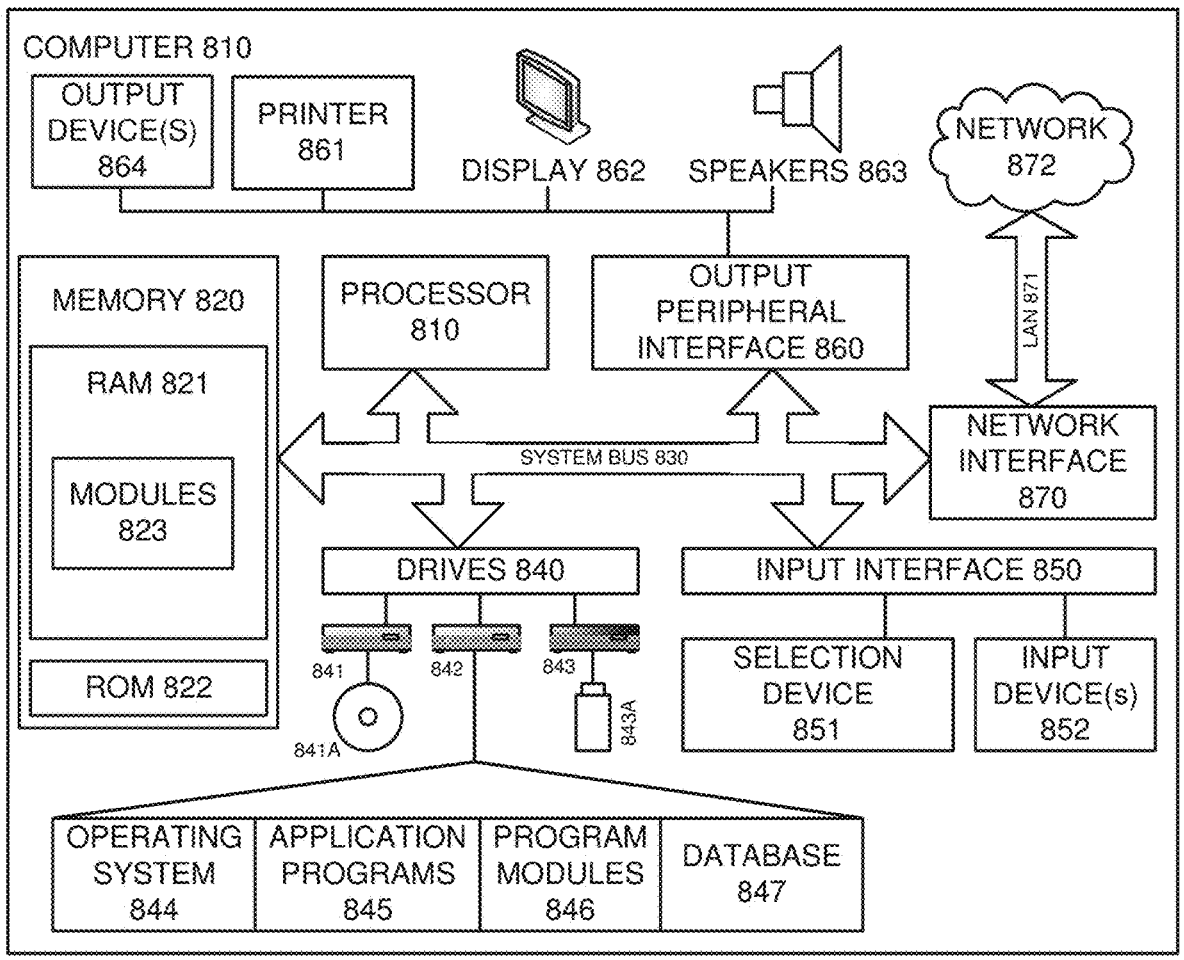
FIG. 8 illustrates an example computing device which can optionally be used in conjunction with embodiments of this disclosure, in accordance with various aspects and embodiments of the subject disclosure.

FIG. 8 illustrates an example computing device which can optionally be used in conjunction with embodiments of this disclosure, in accordance with various aspects and embodiments of the subject disclosure. The computing device 810 can optionally implement the computer 810 introduced in FIG. 2 as well as the controller 105 illustrated in FIG. 1.

Computing device 810 may include for example a processor 810, memory 820, system bus 830, one or more drives 840, user input interface 850, output peripheral interface 860, and network interface 870. Drives 840 may include, for example, a compact disk drive 841 which accepts an optical disk 841A, a so-called hard drive 842, which may employ any of a diverse range of computer readable media, and a flash drive 843 which may employ for example a Universal Serial Bus (USB) type interface to access a flash memory 843A. Drives may further include network drives and virtual drives (not shown) accessed via the network interface 870. The computing device may be supplemented or replaced by an embedded logic device such as a Field-programmable gate array (FPGA).

The drives 840 and their associated computer storage media provide storage of computer readable instructions, data structures, program modules and other data for the computer system 810. For example, a hard drive 842 may include an operating system 844, application programs 845, program modules 846, and database 847. Software aspects of the technologies described herein may be implemented, in some embodiments, as computer readable instructions stored on any of the drives 840 or on network 872, which instructions may be loaded into memory 820, for example as modules 823, and executed by processor 810.

Computer system 810 may further include a wired or wireless input interface 850 through which selection devices 851 and input devices 852 may interact with the other elements of the system 810. Selection devices 851 and input devices 852 can be connected to the input interface 850 which is in turn coupled to the system bus 830, allowing devices 851 and 852 to interact with processor 810 and the other elements of the system 810. Interface and bus structures that may be utilized to implement input interface 850 may include for example a Peripheral Component Interconnect (PCI) type interface, parallel port, game port and a wired or wireless Universal Serial Bus (USB) interface.

Selection devices 851 such as a mouse, trackball, touch screen, or touch pad allow a user to select among desired options and/or data views that may be output by the computer 810, for example via the display 862. Input devices 852 can include any devices through which commands and data may be introduced to the computer 810. For example, in some embodiments the AD converter(s) 220 may be coupled to the computer 810 as an input device 852, and data received from the AD converter(s) 220 may be stored in drives 840. Other example input devices 852 include a keyboard, an electronic digitizer, a microphone, a joystick, game pad, satellite dish, scanner, media player, mobile device, or the like.

Computer system 810 may also include an output peripheral interface 860 which allows the processor 810 and other devices coupled to bus 830 to interact with output devices such as the function generators 211, 212, the AC voltage generator(s) 230, the transmit switches 240, the switch control electronics 260 and solid-state switches 265A, 265B, and optionally a Digital to Analog (DA) converter as discussed further herein. Other example output devices include printer 861, display 862, and speakers 863. Interface and bus structures that may be utilized to implement 860 include those structures that can be used to implement the input interface 850. It should also be understood that many devices are capable of supplying input as well as receiving output, and input interface 850 and output interface 860 may be dual purpose or support two-way communication between components connected to the bus 830 as necessary.

Computing system 810 may operate in a networked environment using logical connections to one or more computers. By way of example, FIG. 8 shows a LAN 871 connection to a network 872. A remote computer may also be connected to network 871. The remote computer may be a personal computer, a server, a router, a network PC, a peer device or other common network node, and can include many or all of the elements described above relative to computing system 810. Networking environments are commonplace in offices, enterprise-wide area networks (WAN), local area networks (LAN), intranets and the Internet.

When used in a LAN or WLAN networking environment, computing system 810 is connected to the LAN through a network interface 870 or an adapter. When used in a WAN networking environment, computing system 810 typically includes a modem or other means for establishing communications over the WAN, such as the Internet or network 872. It will be appreciated that other means of establishing a communications link between computers may be used.

In some embodiments, computing system 810 may include modules 846 and/or 823 comprising, inter alia, one or more SNMR acquisition modules, and one or more SNMR signal data processing modules, which may be referred to herein as SNMR acquisition modules and SNMR processing modules, respectively.

The SNMR acquisition modules may be configured to control transmitting of electrical current pulse sequences on induction coils arrangeable on or above the surface of the Earth. For example, the SNMR acquisition modules may be configured to control the phases of pulses with each pulse sequence, the time between pulses, the number of pulses, the number of pulse sequences, and the time between pulse sequences. The SNMR acquisition modules may be configured to receive a pulse sequence selection or configuration from a user input and may control the electrical current pulse sequences according to the user selection. The SNMR acquisition modules may be configured to send control signals to the various devices illustrated in FIG. 2 to control pulse sequence transmission.

In some embodiments, the SNMR acquisition modules may also be configured to control receiving and recording signal data received in response to transmitted pulse sequences. For example, the SNMR acquisition modules may be configured to operate switch control electronics 260 and solid-state switch modules 265A, 265B, to place the SNMR system 200 in a receive mode to detect signals on the induction coils after and/or during each of the electrical current pulse sequences. Detected signals may be converted to signal data by the AD converter(s) 220, and the signal data may be recorded in a memory of the computing device 810 or elsewhere.

In some embodiments, SNMR processing modules may be configured to linearly combine detected signal data corresponding to separate electrical current pulse sequences to produce combined signal data in which one or more detected signal components are preserved and one or more different detected signal components are reduced or cancelled. The preserved signal components may comprise, for example, NMR signal data, such as desired NMR data, and the reduced or cancelled signal components may comprise undesired NMR signal data and/or non-NMR signal data. Alternatively, the preserved signal components comprise undesired NMR signal data and/or non-NMR signal data, the reduced or cancelled signal components comprise NMR signal data.

SNMR processing modules may be configured to process NMR data that is acquired according to the SNMR acquisition techniques discussed herein. For example, SNMR processing modules may be configured to identify NMR data corresponding to a plurality of different phase-shifted pulse sequences that correspond to a single NMR measurement, and to combine the identified NMR data. Similarly, SNMR processing modules may be configured to identify NMR data corresponding one or more specific pulses within a pulse sequence, and to combine such identified NMR data with NMR data from a corresponding, phase-shifted pulse from another pulse sequence. In some embodiments, the SNMR processing modules may be configured to preserve desired NMR signal data and cancel undesired NMR signal data. For example, SNMR processing modules may be configured to coherently combine detected NMR signals corresponding to separate electrical current pulse sequences to produce a combined NMR signal in which a desired FID signal is preserved, and undesired signals that are coherent with the timing of the electrical current pulse sequences but independent of the phases of the oscillating electrical current pulses are cancelled. Embodiments configured for the opposite operation are also possible, namely cancelling desired NMR signal data and preserving undesired NMR signal data. In some embodiments, SNMR processing modules may also be configured to perform additional processing operations, such as applying linear spatial inversion processing, non-linear spatial inversion processing, or correlation-based spatial processing, to localize detected NMR signals from underground liquids.

Figure 9:
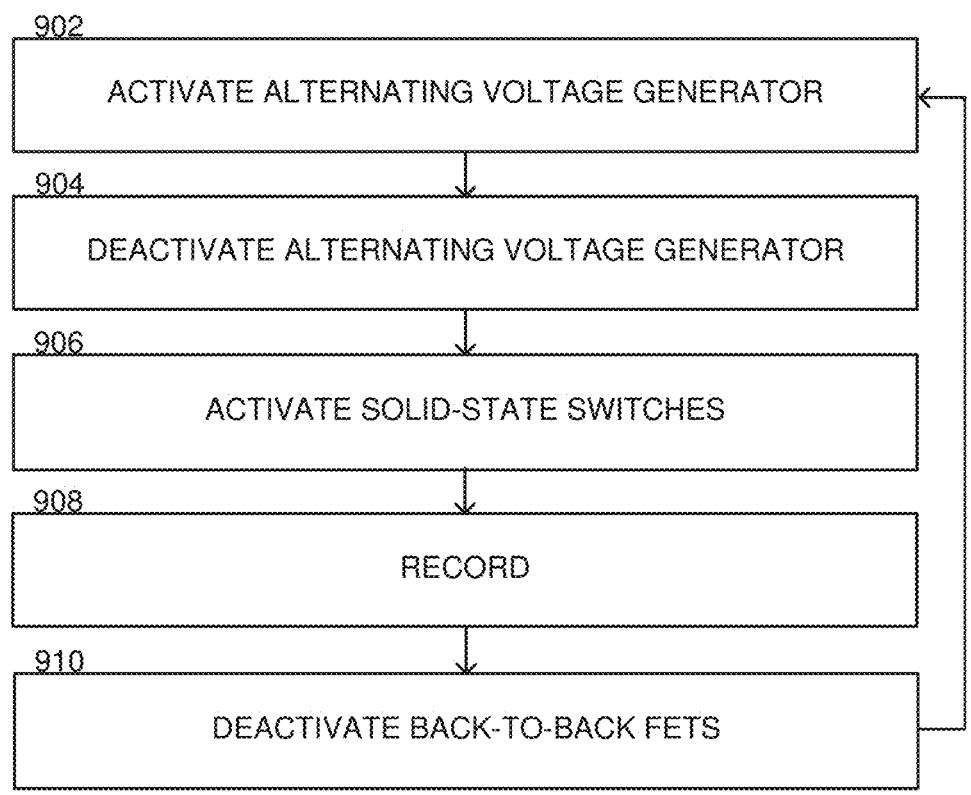
FIG. 9 is a flow diagram representing example operations to isolate circuit elements using selective solid-state isolation techniques, in accordance with various aspects and embodiments of the subject disclosure.

FIG. 9 is a flow diagram representing example operations to isolate circuit elements using selective solid-state isolation techniques in accordance with various aspects and embodiments of the subject disclosure. The various elements illustrated in FIG. 9 represent both operations that may be performed in a method, and modules as may be included in a computing device 810.

The operations illustrated in FIG. 9 can be employed in a NMR or SNMR system, such as illustrated in FIG. 2, or in any circuit employing selective solid-state isolation of circuit elements, e.g. circuits including elements such as illustrated in FIG. 1. The operations include "activate alternating voltage generator" 902, "deactivate alternating voltage generator" 904, "activate solid-state switches" 906, "record" 908, and "deactivate solid-state switches" 910. An arrow from operation 910 to operation 902 indicates that the illustrated operations can be repeated one or more times in a loop.

In an example according to FIG. 9, at 902, an SNMR system 200 can activate AC voltage generator(s) 230. At 904, the SNMR system 200 can deactivate the AC voltage generator(s) 230. At 906, the SNMR system 200 can activate the solid-state switches 265A, 265B in order to couple the preamplifier(s) 270 with the induction coil(s) 250. At 908, the SNMR system 200 can record NMR voltages on the induction coil(s) 250. At 910, the SNMR system 200 can deactivate the solid-state switches 265A, 265B in order to isolate the preamplifier(s) 270 from the induction coil(s) 250. The SNMR system 200 can subsequently return to operation 902 and repeat the illustrated operations as needed for a particular pulse sequence.

In some embodiments according to FIG. 9, the use of solid-state switches 265A, 265B can be combined with processing methods that further reduce noise. For example, a phase cycled SNMR data acquisition and recombination set can comprise two phase cycles, e.g., two pulse sequences in which the phase of one or more pulses in the second pulse sequence is different from a phase of a corresponding pulse in the first pulse sequence. A first SNMR pulse sequence is applied, resulting in the recording and storage of a first data set. The phase of one or more of the pulses in the pulse sequence is changed and the pulse sequence is reapplied resulting in the recording and storage of a second data set. The relative phases of the desired NMR signal and undesired signal(s) are different in the two data sets and, due to the change of the phase in the one or more transmit pulses between the first pulse sequence and second pulse sequence. The two data sets may be linearly combined into a single data set via multiplication by real or complex scalars and subsequent summation. In the combined and stored data set, a desired NMR signal is preserved and one or more undesired signals(s) are canceled or reduced.

A single induction coil may be used for both transmitting and detection, or separate coils may be used for transmitting and detection functions. SNMR detection methods disclosed herein may employ multiple transmit and detection coils, for example as disclosed in U.S. Pat. No. 7,466,128. Various methods have been developed for localizing NMR signals acquired via SNMR detection techniques, and these localization methods have been applied to localize NMR signals in one, two or three dimensions. Various methods have also been developed and applied to estimate aquifer and reservoir properties based on NMR data obtained using the SNMR detection technique, and such methods may also be combined with the operations disclosed herein.

In some embodiments, the SNMR methods disclosed herein may be used to detect fluids beneath the surface of the Earth, including groundwater and hydrocarbon fluids. SNMR techniques may also applicable to detection of fluids beneath and within man-made structures, including earthen or concrete dams, levees, mine tailing piles, piles of raw or processed materials, and landfills. SNMR methods are also potentially useful for detecting fluids beneath the surfaces of extraterrestrial bodies, including nearby planets such as Mars. In the extraterrestrial application, the method would rely upon a local static magnetic field produced by the extraterrestrial body itself, rather than the Earth's magnetic field.

In some embodiments, SNMR methods may generally comprise the transmission of a specific sequence of pulses, to activate NMR signal processes in the Earth's magnetic field, and the simultaneous detection of desired NMR signals due to fluids in the subsurface. The SNMR detection method may thus produce data that is subsequently useful for analysis of distribution of fluid content in the subsurface.

Figure 10:
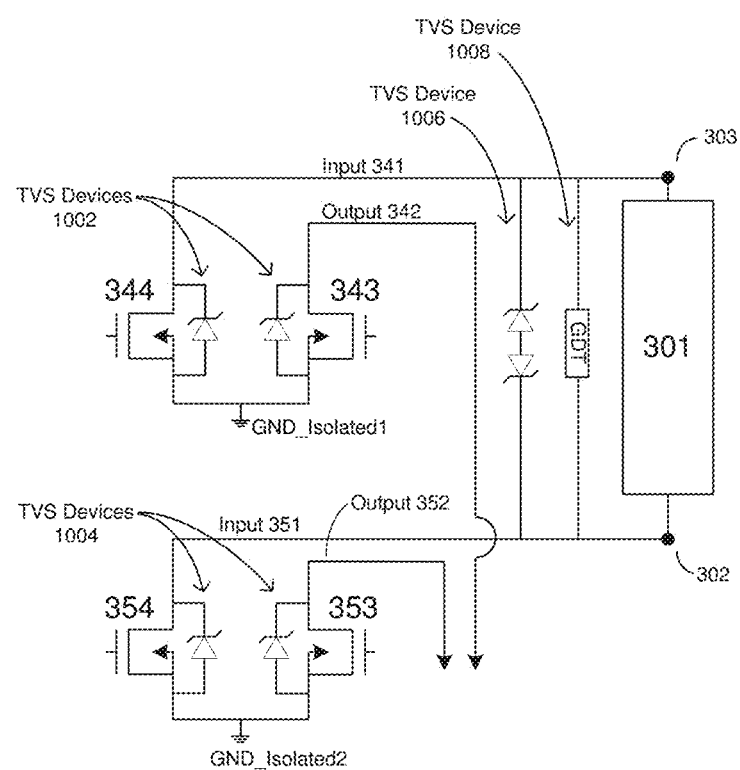
FIG. 10 illustrates example deployment of transient voltage suppression (TVS) devices in the circuit illustrated in FIG. 3, in accordance with various aspects and embodiments of the subject disclosure.

FIG. 10 illustrates example deployment of transient voltage suppression (TVS) devices in the circuit illustrated in FIG. 3, in accordance with various aspects and embodiments of the subject disclosure. FIG. 10 illustrates the receive coil 301, input 341, output 342, FET 344, FET 343, input 351, output 352, FET 354, and FET 353, previously described in connection with FIG. 3. FIG. 10 furthermore illustrates example TVS devices 1002, example TVS devices 1004, example TVS device 1006, and example TVS device 1008. Any one of the illustrated example TVS devices, or any subset of the illustrated example TVS devices, can optionally be included in a circuit according to FIG. 3.

The illustrated example TVS devices may be included to protect the solid state switch modules 340, 350 (see FIG. 3), or other circuit components from damage in case the voltage across the AC voltage element 301 exceeds a maximum standoff voltage provided by the solid state switches. The TVS devices can be configured to shunt current between two terminals if the differential voltage between the terminals exceeds a threshold voltage. Appropriate TVS devices may include TVS diodes, gas discharge tubes (GDTs), or zener diodes. As example, in FIG. 10, a bi-polar TVS device 1006 with a threshold voltage of 2000V placed between terminals 302 and 303 (in parallel with the AC voltage element 301) would limit the voltage seen by the solid state switches to 2000V, even if the differential voltage at terminals 302 and 303 exceeded 2000V. As another example, TVS devices 1002 and 1004 can be placed in parallel between the source and drain of each discrete FET to ensure the voltage across a FET does not exceed the FET's maximum rated $V_{DS}$ FIG. 10 illustrates some of the elements of FIG. 3, for simplicity of illustration, understanding that the other elements of FIG. 3 can be included in circuits according to FIG. 10. Furthermore, any of the illustrated example TVS devices can be included in any of the other example circuits disclosed herein.

There is little distinction left between hardware and software implementations of aspects of systems; the use of hardware or software is generally (but not always) a design choice representing cost vs. efficiency tradeoffs. There are various vehicles by which processes and/or systems and/or other technologies described herein can be effected (e.g., hardware, software, and/or firmware), and that the preferred vehicle may vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be within the skill of one skilled in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems. The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various embodiments have been disclosed herein, other aspects and embodiments will be apparent to those skilled in art.

The invention claimed is:

1. A nuclear magnetic resonance device, comprising:
   transmit electronics to generate alternating current transmit pulses;
   at least one induction coil coupled with the transmit electronics, wherein the alternating current transmit pulses produce a corresponding alternating voltage on the at least one induction coil and the alternating current transmit pulses excite a nuclear magnetization response from an underground fluid;
   receive electronics comprising at least a preamplifier and an analog to digital converter, wherein the receive electronics are coupled with the at least one induction coil and detect and process signal voltages associated with the nuclear magnetization response produced by the underground fluid in response to the transmit pulses;
   a first electrical connection between a first end of the at least one induction coil and the receive electronics;
   a second electrical connection between a second end of the at least one induction coil and the receive electronics;
   at least one back-to-back field effect transistor (FET) pair to selectively activate and deactivate at least one of the electrical connections; and
   electrically isolated gate drive electronics to operate the at least one back-to-back FET pair in order to selectively couple or decouple the receive electronics from the at least one induction coil.

2. The nuclear magnetic resonance device of claim 1, wherein the at least one back-to-back FET pair comprises multiple back-to-back FET pairs disposed in series to thereby yield a higher standoff voltage than a single pair of back-to-back FETs.

3. The nuclear magnetic resonance device of claim 2, wherein the multiple back-to-back FET pairs are disposed at either the first electrical connection or the second electrical connection.

4. The nuclear magnetic resonance device of claim 2, wherein the multiple back-to-back FET pairs are disposed at both the first electrical connection and the second electrical connection.

5. The nuclear magnetic resonance device of claim 4, wherein the multiple back-to-back FET pairs comprise first multiple back-to-back FET pairs disposed at the first electrical connection, and second multiple back-to-back FET pairs disposed at the second electrical connection.

6. The nuclear magnetic resonance device of claim 2, wherein the multiple back-to-back FET pairs disposed in series provide a combined on resistance of four ohms or less and a combined standoff voltage of twelve hundred volts or more.

7. The nuclear magnetic resonance device of claim 1, wherein the at least one back-to-back FET pair provides an on resistance of two ohms or less, a standoff voltage of six hundred volts or more across the induction coil, and a switching time of one millisecond or less.

8. The nuclear magnetic resonance device of claim 1, wherein a FET of the at least one back-to-back FET pair comprises a silicon carbide FET or a gallium nitride FET.

9. The nuclear magnetic resonance device of claim 1, wherein the electrically isolated gate drive electronics comprise at least one optocoupler and at least one isolated power supply.

10. The nuclear magnetic resonance device of claim 1, wherein the electrically isolated gate drive electronics and the at least one induction coil are connected to different electrical grounds.

11. The nuclear magnetic resonance device of claim 1, wherein the at least one back-to-back FET pair comprises multiple back-to-back FET pairs, and wherein the electrically isolated gate drive electronics comprise multiple independent groups of electrically isolated gate drive electronics, where each independent group operates at least one different pair of the multiple back-to-back FET pairs.

12. The nuclear magnetic resonance device of claim 1, wherein the electrically isolated gate drive electronics operate the at least one back-to-back FET pair according to a receive timing that is based on a transmit timing of the alternating current transmit pulses.

13. The nuclear magnetic resonance device of claim 1, wherein the at least one back-to-back FET pair is implemented within an integrated circuit.

14. The nuclear magnetic resonance device of claim 1, further comprising at least one transient voltage suppression device to protect the at least one back-to-back FET from an excess voltage.

15. The nuclear magnetic resonance device of claim 1, wherein the nuclear magnetic resonance device is configured as a surface nuclear magnetic resonance device.

16. The nuclear magnetic resonance device of claim 1, wherein the nuclear magnetic resonance device is configured as a borehole nuclear magnetic resonance device.

17. A nuclear magnetic resonance device, comprising:
transmit electronics to generate alternating current transmit pulses;
at least one induction coil coupled with the transmit electronics, wherein the alternating current transmit pulses produce a corresponding alternating voltage on the at least one induction coil and the alternating current transmit pulses excite a nuclear magnetization response from an underground fluid;
receive electronics comprising at least a preamplifier and an analog to digital converter, wherein the receive electronics are coupled with the at least one induction coil and detect and process signal voltages associated with the nuclear magnetization response produced by the underground fluid in response to the transmit pulses;
an electrical connection between the at least one induction coil and the receive electronics;
at least one pair of back-to-back field effect transistors (FETs) to selectively activate and deactivate the electrical connection; and
gate drive electronics to operate the at least one pair of back-to-back FETs in order to selectively decouple the receive electronics from the at least one induction coil.

18. The nuclear magnetic resonance device of claim 17, wherein the at least one pair of back-to-back FETs provides an on resistance of two-hundred milliohms or less, a standoff voltage of one thousand volts or more, and a switching time of one millisecond or less.

19. The nuclear magnetic resonance device of claim 17, wherein the at least one pair of back-to-back FETs comprises a silicon carbide FET or a gallium nitride FET.

20. The nuclear magnetic resonance device of claim 17, wherein the gate drive electronics include electrical isolation components to isolate the at least one induction coil.

21. The nuclear magnetic resonance device of claim 20, wherein the electrical isolation components comprise an optocoupler and an isolated power supply.

22. The nuclear magnetic resonance device of claim 17, wherein gate drive electronics operate the at least one pair of back-to-back FETs according to a receive timing that is based on a transmit timing of the alternating current transmit pulses.

23. The nuclear magnetic resonance device of claim 17, wherein the nuclear magnetic resonance device is configured as a surface nuclear magnetic resonance device.

24. The nuclear magnetic resonance device of claim 17, wherein the nuclear magnetic resonance device is configured as a borehole nuclear magnetic resonance device.

\* \* \* \* \*